(12) United States Patent
Endo et al.

(10) Patent No.: US 9,165,782 B2
(45) Date of Patent: Oct. 20, 2015

(54) ADDITIVE FOR RESIST UNDERLAYER FILM-FORMING COMPOSITION AND RESIST UNDERLAYER FILM-FORMING COMPOSITION CONTAINING THE SAME

(71) Applicant: NISSAN CHEMICAL INDUSTRIES, LTD., Tokyo (JP)

(72) Inventors: Takafumi Endo, Toyama (JP); Rikimaru Sakamoto, Toyama (JP); Noriaki Fujitani, Toyama (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 0 days.

(21) Appl. No.: 14/352,821

(22) PCT Filed: Oct. 12, 2012

(86) PCT No.: PCT/JP2012/076458
§ 371 (c)(1),
(2) Date: Apr. 18, 2014

(87) PCT Pub. No.: WO2013/058189
PCT Pub. Date: Apr. 25, 2013

(65) Prior Publication Data
US 2014/0287589 A1 Sep. 25, 2014

(30) Foreign Application Priority Data
Oct. 20, 2011 (JP) .................. 2011-230735

(51) Int. Cl.
| | |
|---|---|
| *C09K 13/06* | (2006.01) |
| *H01L 21/308* | (2006.01) |
| *C08F 20/36* | (2006.01) |
| *C08F 220/36* | (2006.01) |
| *G03F 7/11* | (2006.01) |
| *C08F 220/32* | (2006.01) |
| *C08F 8/14* | (2006.01) |
| *H01L 21/027* | (2006.01) |

(52) U.S. Cl.
CPC .............. *H01L 21/3081* (2013.01); *C08F 8/14* (2013.01); *C08F 20/36* (2013.01); *C08F 220/32* (2013.01); *C08F 220/36* (2013.01); *G03F 7/11* (2013.01); *H01L 21/0271* (2013.01)

(58) Field of Classification Search
CPC ..... G03F 7/085; G03F 7/091; H01L 21/3081; H01L 21/0271; H01L 21/30

USPC .............. 252/79.1, 79.2, 79.3, 79.4; 430/312, 430/313, 316; 438/712, 714, 717, 723
See application file for complete search history.

(56) References Cited

U.S. PATENT DOCUMENTS

| | | | |
|---|---|---|---|
| 7,632,626 B2* | 12/2009 | Sakamoto ............... 430/311 |
| 8,329,384 B2* | 12/2012 | Watanabe et al. ........ 430/312 |
| 8,685,615 B2* | 4/2014 | Kimura et al. .......... 430/270.1 |
| 2010/0233620 A1* | 9/2010 | Choi et al. ............... 430/270.1 |

FOREIGN PATENT DOCUMENTS

| | | |
|---|---|---|
| JP | A-2012-036385 | 2/2012 |
| WO | WO 03/017002 A1 | 2/2003 |
| WO | WO 2004/074335 A1 | 9/2004 |
| WO | WO 2004/074336 A1 | 9/2004 |
| WO | WO 2010/074075 A1 | 7/2010 |
| WO | WO 2011/074433 A1 | 6/2011 |

OTHER PUBLICATIONS

International Search Report issued in International Patent Application No. PCT/JP2012/076458 mailed Nov. 6, 2012.
Written Opinion of the International Searching Authority issued in International Patent Application No. PCT/JP2012/076458 mailed Nov. 6, 2012.

* cited by examiner

*Primary Examiner* — Lan Vinh
(74) *Attorney, Agent, or Firm* — Oliff PLC

(57) ABSTRACT

It is aimed to enhance adhesiveness between a resist pattern formed on a resist underlayer film and to reduce an undercut of the resist pattern. An additive for a resist underlayer film-forming composition, including: a polymer having a structural unit of Formula (1):

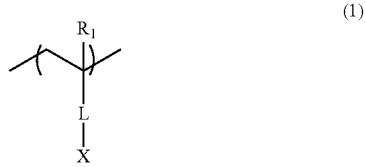

(where $R_1$ is a hydrogen atom or a methyl group; L is a divalent linking group; X is an acyloxy group having an amino group protected with a tert-butoxycarbonyl group or a nitrogen heterocycle protected with a tert-butoxycarbonyl group).

6 Claims, No Drawings

ADDITIVE FOR RESIST UNDERLAYER FILM-FORMING COMPOSITION AND RESIST UNDERLAYER FILM-FORMING COMPOSITION CONTAINING THE SAME

TECHNICAL FIELD

The present invention relates to an additive added to a resist underlayer film-forming composition. The present invention particularly relates to an additive (reforming agent) for reforming the surface layer of a resist underlayer film to be formed, improving adhesiveness to a resist, and forming a pattern with a desired shape on the resist underlayer film. The present invention also relates to a resist underlayer film-forming composition comprising the additive (reforming agent).

BACKGROUND ART

In ArF liquid immersion lithography and extreme ultraviolet (EUV) lithography, processing dimensions of resist line widths have been required to be finer. In formations of such fine resist patterns, as the contact area between a resist pattern and a base substrate becomes smaller, the aspect ratio of the resist pattern (the height of the resist pattern/the line width of the resist pattern) becomes larger, which may facilitate collapse of the resist pattern. Therefore, a resist underlayer film (anti-reflective coating) that is in contact with a resist has been required to be highly adhesive to the resist so that collapse of the resist pattern is avoided.

It has been disclosed that, in achieving high adhesiveness of a resist under layer film to a resist, employing a lactone structure as a structural component of a resist underlayer film-forming composition improves adhesiveness of the resist underlayer film to a resist pattern to be obtained (Patent Document 1). In other words, by using a structure having a polar moiety such as a lactone structure as a structural component of a resist underlayer film-forming composition, adhesiveness to a resist pattern is expected to be improved, and collapse of a resist pattern is expected to be prevented even in a fine resist pattern.

However, in a lithography process requiring formation of finer resist patterns, such as ArF liquid immersion lithography and extreme ultraviolet (EUV) lithography, a lactone structure contained in a resist underlayer film-forming composition as a structural component does not sufficiently prevent collapse of a resist pattern.

PRIOR ART DOCUMENT

Patent Document

Patent Document 1: WO03/017002

SUMMARY OF THE INVENTION

Problem to be Solved by the Invention

A method for controlling the chemical state of the interface between a resist and a resist underlayer film resist is one example of methods to obtain high adhesiveness to resists. Specifically, in a positive-type resist, when the chemical state of the interface between a resist and a resist underlayer film is acidic, an obtained resist pattern has an undercut shape, and a contact area with the resist pattern extremely decreases to facilitate collapse of the resist pattern. In contrast, when the chemical state of the interface between a resist and a resist underlayer film is basic, the undercut of a resist pattern can be suppressed. Thus, adhesiveness to the resist is expected be stronger than that obtained by introducing a polar moiety such as a lactone structure.

It is an object of the present invention to provide an additive for a resist underlayer film-forming composition that enhances adhesiveness between a resist pattern formed on a resist underlayer film and the resist underlayer film, and reforms the state of the surface of a resist underlayer film to be basic so that an undercut of the resist pattern is reduced.

Means for Solving the Problem

The present invention provides, as a first aspect, an additive for a resist underlayer film-forming composition, comprising: a polymer having a structural unit of Formula (1):

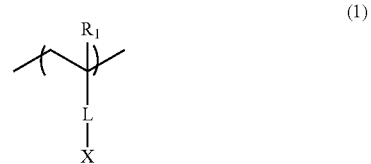

(where $R_1$ is a hydrogen atom or a methyl group; L is a divalent linking group; X is an acyloxy group having an amino group protected with a tert-butoxycarbonyl group or a nitrogen heterocycle protected with a tert-butoxycarbonyl group).

The present invention provides, as a second aspect, an additive for a resist underlayer film-forming composition, comprising: a copolymer having a structural unit of Formula (1') and a structural unit of Formula (2):

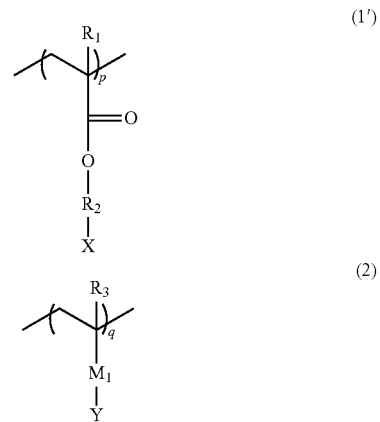

(where each of $R_1$ and $R_3$ is independently a hydrogen atom or a methyl group; $R_2$ is a $C_{2-4}$ alkylene group, one or more hydrogen atoms of the alkylene group are optionally substituted with hydroxy group(s); X is an acyloxy group having an amino group protected with a tert-butoxycarbonyl group or a nitrogen heterocycle protected with a tert-butoxycarbonyl group; $M_1$ is a direct binding or a linking group having at least one selected from the group consisting of "—C(=O)—", "—CH$_2$—", and "—O—"; Y is a $C_{2-6}$ alkyl group in which at least one hydrogen atom is substituted with a fluorine atom; and p and q represent a molar ratio of the structural units contained in the copolymer, in which each of p and q is within a range from 0.1 to 0.9 (provided that p+q=1 is satisfied)).

The present invention provides, as a third aspect, a resist underlayer film-forming composition for lithography, comprising: a resin binder; an organic solvent; and the additive for a resist underlayer film-forming composition as described in the first aspect or the second aspect. The resist underlayer film-forming composition may further comprise: a cross-linker; and a cross-linking catalyst.

The present invention provides, as a fourth aspect, a method for producing a semiconductor element, the method comprising: applying the resist underlayer film-forming composition as described in the third aspect onto a substrate having a film to be processed in which a transfer pattern is to be formed; baking the resist underlayer film-forming composition thus applied to form a resist underlayer film; covering the resist underlayer film with a resist; irradiating the substrate covered with the resist with radiation selected from the group consisting of a KrF excimer laser, an ArF excimer laser, an extreme ultraviolet, and an electron beam; forming a resist pattern by development; and transferring a pattern onto the substrate by dry etching using the resist pattern as a mask.

Effects of the Invention

Application of a resist underlayer film-forming composition to which an additive of the present invention has been added, to a lithography process can effectively reduce collapse of a formed resist pattern even if the resist pattern has a fine line width.

MODES FOR CARRYING OUT THE INVENTION

The additive according to the first aspect of the present invention comprises a polymer having a structural unit of Formula (1). The polymer may be either a homopolymer or a copolymer. Although a divalent linking group of L in Formula (1) is not particularly limited, examples thereof include a —C(=O)OR$_2$— group and a phenylene group, and R$_2$ of the —C(=O)OR$_2$— group has the same meaning of R$_2$ in a structural unit of Formula (1').

The acyloxy group of X in Formula (1), which has an amino group protected with a tert-butoxycarbonyl group or a nitrogen heterocycle protected with a tert-butoxycarbonyl group, is represented by, for example, any of Formulae (a) to (j) below. Here, the acyloxy group is "—OC(=O)—R" (R is an organic group having an amino group protected with a tert-butoxycarbonyl group or an organic group having a nitrogen heterocycle protected with a tert-butoxycarbonyl group), and the tert-butoxycarbonyl group may be abbreviated as "t-Boc" or "Boc".

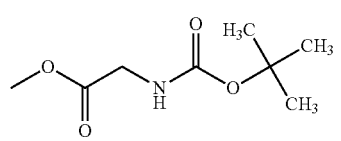

(a)

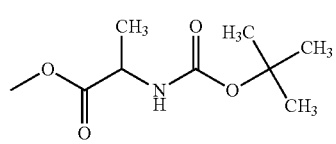

(b)

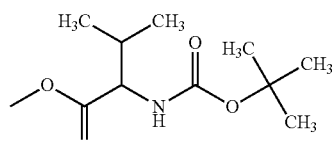

(c)

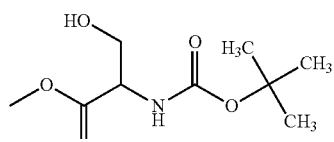

(d)

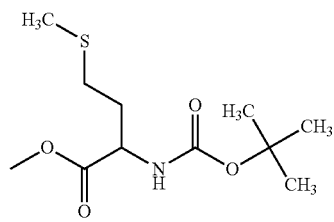

(e)

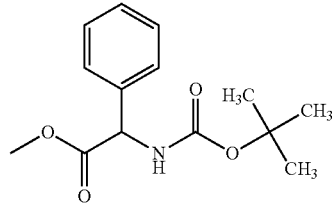

(f)

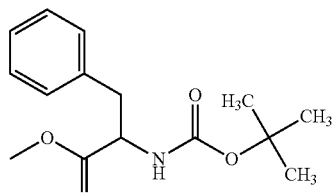

(g)

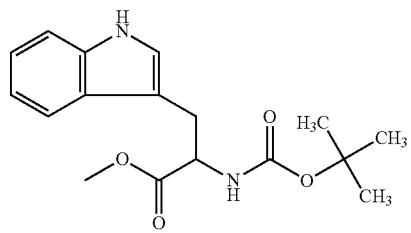

(h)

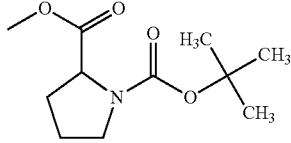

(i)

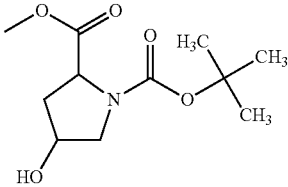

(j)

The polymer having a structural unit of Formula (1) can be obtained by, for example, causing a polymer having an epoxy group on its end to react with a monomer reactive with the epoxy group. Examples of such a monomer include N-(tert-butoxycarbonyl)glycine, N-(tert-butoxycarbonyl) alanine, N-(tert-butoxycarbonyl) valine, N-(tert-butoxycarbonyl) leucine, N-(tert-butoxycarbonyl) isoleucine, N-(tert-butoxycarbonyl) methionine, N-(tert-butoxycarbonyl) serine, N-(tert-butoxycarbonyl) threonine, N-(tert-butoxycarbonyl) proline, N-(tert-butoxycarbonyl)-histidine, N-(tert-butoxycarbonyl) phenylalanine, N-(tert-butoxycarbonyl) tyrosine, N-(tert-butoxycarbonyl) tryptophan, O-benzyl-N-(tert-butoxycarbonyl) serine, 4-benzyl N-(tert-butoxycarbonyl) aspartate, 5-benzyl N-(tert-butoxycarbonyl) glutamate, N-(tert-butoxycarbonyl) asparagine, N-(tert-butoxycarbonyl)-S-benzyl cysteine, N-(tert-butoxycarbonyl)-O-benzyl threonine, N-(tert-butoxycarbonyl)-O-benzyl tyrosine, N-(tert-butoxycarbonyl)-O-tert-butyl tyrosine, N-(tert-butoxycarbonyl)-N-carbobenzoxy lysine, N-(tert-butoxycarbonyl)-3,4-difluorophenyl alanine, N-(tert-butoxycarbonyl)-4-fluorophenyl alanine, N-(tert-butoxycarbonyl)-N1-formyl tryptophan, N-(tert-butoxycarbonyl) glutamine, N-(tert-butoxycarbonyl)-4-hydroxyproline, N-(tert-butoxycarbonyl)-4-nitrophenylalanine, and N-(tert-butoxycarbonyl)-(para toluenesulfonyl histidine). Among them, N-(tert-butoxycarbonyl)glycine, N-(tert-butoxycarbonyl) alanine, N-(tert-butoxycarbonyl) leucine, N-(tert-butoxycarbonyl) methionine, N-(tert-butoxycarbonyl) serine, N-(tert-butoxycarbonyl) proline, N-(tert-butoxycarbonyl)-4-hydroxyproline are preferable, and N-(tert-butoxycarbonyl) proline is particularly preferable.

The additive according to the second aspect of the present invention comprises a copolymer having a structural unit of Formula (1') and a structural unit of Formula (2). In Formula (1'), examples of the $C_{2-4}$ alkylene group of $R_2$ (one or more hydrogen atoms of the alkylene group are optionally substituted with hydroxy group(s)) include an ethylene group and a —$CH_2$—CH(OH)—$CH_2$— group. The acyloxy group of X in Formula (1'), which has an amino group protected with a tert-butoxycarbonyl group or a nitrogen heterocycle protected with a tert-butoxycarbonyl group, has the same meaning of X in a structural unit of Formula (1).

Examples of a linking group of $M_1$ in Formula (2), which has at least one selected from the group consisting of "—C(=O)—", "—$CH_2$—", and "—O—" include a —C(=O)O— group, and a —C(=O)O—$CH_2$— group. When $M_1$ is a direct binding, a $C_{2-6}$ alkyl group of Y, in which at least one hydrogen atom is substituted with a fluorine atom, directly binds to a main chain. Examples of a monomer forming a structural unit of Formula (2) include monofluoroethyl acrylate, monofluoroethyl methacrylate, trifluoroethyl acrylate, trifluoroethyl methacrylate, tetrafluoropropyl acrylate, tetrafluoropropyl methacrylate, pentafluoropropyl acrylate, pentafluoropropyl methacrylate, hexafluoropropyl acrylate, hexafluoropropyl methacrylate, hexafluoroisopropyl acrylate, hexafluoroisopropyl methacrylate, hexafluorobutyl acrylate, hexafluorobutyl methacrylate, heptafluorobutyl acrylate, heptafluorobutyl methacrylate, octafluoropentyl acrylate, and octafluoropentyl methacrylate. Among these examples, trifluoroethyl methacrylate is preferable. The copolymer having a structural unit of Formula (1') and a structural unit of Formula (2) can be obtained by, for example, causing an acrylic copolymer having an epoxy group on its end to react with the aforementioned monomer reactive with the epoxy group.

In Formula (1), p is usually 0.05 to 0.95, and q is usually 0.05 to 0.95 so that collapse of a resist pattern is reduced and function of a resist underlayer film is improved by introducing a structural unit of Formula (2). Preferably, p is 0.2 to 0.8, and q is 0.2 to 0.8.

A copolymer of an additive according to the second aspect of the present invention may further include a structural unit of Formula (3):

(where $R_4$ is a hydrogen atom or a methyl group; $M_2$ is a direct binding or a linking group having at least one selected from the group consisting of "—C(=O)—", "—$CH_2$—", and "—O—"; Z is a $C_{1-6}$ alkyl group, an aryl group, or an arylalkyl group that has at least one of a hydroxy group, an alkoxy group, and a carboxy group; or when $M_2$ is a direct binding, Z is a carboxy group; p, q, and r represent a molar ratio of structural units contained in the polymer, and each of p, q, and r is within a range from 0.1 to 0.9 (provided that p+q+r=1 is satisfied)).

Examples of a linking group of $M_2$ in Formula (3), which has at least one selected from the group consisting of "—C(=O)—", "—$CH_2$—", and "—O—" include a —C(=O)O— group and a —C(=O)O—$CH_2$— group. When $M_2$ is a direct binding, a $C_{1-6}$ alkyl group, an aryl group, or an arylalkyl group of Z, which has at least one of a hydroxy group, an alkoxy group, and a carboxy group, or a carboxy group of Z, directly binds to a main chain. Examples of the alkoxy group include a methoxy group, an ethoxy group, and a tert-butoxy group. Examples of the aryl group include a phenyl group and a naphthyl group. Examples of the arylalkyl group include a benzyl group and a phenethyl group. Examples of a monomer forming a structural unit of Formula (3) include hydroxyethyl acrylate, hydroxyethyl methacrylate, hydroxypropyl acrylate, hydroxypropyl methacrylate, dihydroxypropyl acrylate, dihydroxypropyl methacrylate, hydroxybutyl acrylate, hydroxybutyl methacrylate, hydroxypentyl acrylate, hydroxypentyl methacrylate, hydroxy styrene, 4-tert-butoxy styrene, hydroxyphenyl acrylate, hydroxyphenyl methacrylate, acrylic acid, methacrylic acid, and carboxy styrene.

p is usually 0.05 to 0.95, q is usually 0.05 to 0.95, and r is usually 0.05 to 0.95 so that collapse of a resist pattern is reduced and function of a resist underlayer film is improved by introducing a structural unit of Formula (3). Preferably, p is 0.2 to 0.8, q is 0.2 to 0.8, and r is 0.2 to 0.8.

A resist underlayer film-forming composition according to the third aspect of the present invention can be composed by containing an additive for a resist underlayer film-forming composition of the present invention together with a resin binder in an organic solvent. The percentage of the polymer having a structural unit of Formula (1) or the copolymer having structural units of Formula (1') and Formula (2) contained in the resist underlayer film-forming composition is, for example, 0.5% by mass to 30% by mass, and the weight average molecular weight of the polymer or the copolymer is, for example, 5,000 to 50,000, and preferably 10,000 to 30,000.

Examples of the organic solvent contained in the resist underlayer film-forming composition of the present invention include propylene glycol monomethyl ether (PGME), propylene glycol monomethyl ether acetate (PGMEA), propylene glycol monoethyl ether, propylene glycol monopropyl ether, methyl ethyl ketone, ethyl lactate, cyclohexanone, γ-butyrolactone, N-methylpyrrolidone, and a mixture of two or more types selected from these organic solvents. The percentage of the organic solvent in the resist underlayer film-forming composition of the present invention is, for example, 50% by mass to 99.5% by mass.

A polymer obtained in Synthesis Example 1 to be described later, for example, can be used as a resin binder contained in the resist underlayer film-forming composition of the present invention. A base polymer contained in either a well-known anti-reflective coating-forming composition or a well-known resist underlayer film-forming composition can be used as the resin binder. The percentage of the resin binder in the solid content of the resist underlayer film-forming composition of the present invention, excluding the organic solvent, is, for example, 50% by mass to 99.5% by mass and preferably 60% by mass to 90% by mass.

The resist underlayer film-forming composition of the present invention includes the aforementioned polymer or copolymer as an additive. The percentage of the additive in the solid content of the resist underlayer film-forming composition of the present invention is, for example, 0.1% by mass to 30% by mass and preferably 1% by mass to 15% by mass.

The resist underlayer film-forming composition of the present invention may optionally contain a cross-linker. Examples of the cross-linker include bexamethoxymethyl melamine, tetramethoxymethyl benzoguanamine, 1,3,4,6-tetrakis(methoxymethyl)glycoluril (POWDERLINK [registered trademark] 1174), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea. When the cross-linker is used, the percentage of the cross-linker to be contained is, for example, 1% by mass to 30% by mass of the resin binder.

The resist underlayer film-forming composition of the present invention may optionally contain a cross-linking catalyst facilitating a cross-linking reaction. Examples of the cross-linking catalyst include sulfonic acid compounds and carboxylic acid compounds, such as p-toluenesulfonic acid, trifluoromethanesulfonic acid, pyridinium-p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid. When the cross-linking catalyst is used, the percentage of the cross-linking catalyst to be contained is, for example, 0.1% by mass to 10% by mass of the cross-linker. When the resin binder is a self-cross-linking-type polymer, the cross-linker and the cross-linking catalyst are not essential components for the resist underlayer film-forming composition of the present invention.

Although a representative substrate used in a method for manufacturing a semiconductor element according to the fourth aspect of the present invention is a silicon wafer, a silicon on insulator (SOI) substrate or a compound semiconductor wafer such as gallium arsenide (GaAs), indium phosphide (InP), and gallium phosphide (GaP) may also be used. On the substrate, for example, an insulating film such as a silicon oxide film, a nitrogen-containing silicon oxide film (a SiON film), a carbon-containing silicon oxide film (a SiOC film), or a fluorine-containing silicon oxide film (a SiOF film) is formed as a film to be processed. In this case, a resist underlayer film is formed on a film to be processed.

In the method according to the present invention, a resist solution covering a resist may be either positive-type or negative-type, and a chemically amplified resist photosensitive to radiation selected from the group consisting of a KrF excimer laser, an ArF excimer laser, extreme ultraviolet, and an electron beam can be used.

In the method according to the present invention, an alkali developing solution such as a tetramethylammonium hydroxide (TMAH) aqueous solution can be used as a developing solution used for development after the radiation is emitted.

The present invention will be specifically explained by reference to Synthesis Examples and Examples; however, the present invention is not limited to descriptions of the Synthesis Examples and Examples.

The weight average molecular weight of each of the polymers described in Synthesis Example 1 to Synthesis Example 12 of the present specification was measured by gel permeation chromatography (hereinafter, abbreviated as GPC). The GPC device manufactured by Tosoh Corporation was used for measurements, and measuring conditions and the like are described below.

GPC column: Shodex [registered trademark] Asahipak [registered trademark] (Showa Denko K.K.)
Column temperature: 40° C.
Solvent: N,N-dimethylformamide (DMF)
Flux: 0.6 ml/minute
Standard sample: polystyrene (Tosoh Corporation)

Epoxy values described in Synthesis Examples 2 and 3 were measured with an automatic titrator (the product name: GT-100) manufactured by Mitsubishi Chemical Corporation, and a 0.1 M perchloric acid-acetic acid solution was used as a solution for titration.

EXAMPLES

Synthesis Example 1

14.00 g of diglycidyl 1,4-terephthalate (the product name: EX-711 [registered trademark], Nagase ChemteX Corporation), 8.08 g of isophthalic acid, 0.90 g of ethyltriphenyl phosphonium bromide, and 91.94 g of propylene glycol monomethyl ether were mixed, and the mixture was heated to reflux for 4 hours with stirring to obtain a polymer solution. To this solution, 23 g of a cation exchange resin (the product name: DOWEX [registered trademark] 550A, Muromachi Technos Co., Ltd.) and 23 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 25,000 in terms of standard polystyrene. The polymer obtained in this Synthesis Example was equivalent to a resin binder contained in a resist underlayer film-forming composition of the present invention.

Synthesis Example 2

152.44 g of propylene glycol monomethyl ether was added to 2.67 g of azobisisobutyronitrile, and heated to 80° C. Into the heated solution, a mixed solution of 37.00 g of glycidyl methacrylate, 10.94 g of trifluoroethyl methacrylate, and 50.00 g of propylene glycol monomethyl ether was gradually added dropwise, and the resultant mixture was reacted at 80° C. for 17 hours to obtain a polymer solution. A GPC analysis showed that the weight average molecular weight of the obtained polymer was 6,200 in terms of standard polystyrene, and the epoxy value of the polymer solution was 1.04 eq/kg. The polymer obtained in this Synthesis Example was equivalent to an intermediate to synthesize a copolymer for an additive according to the present invention.

Synthesis Example 3

168.86 g of propylene glycol monomethyl ether was added to 2.89 g of azobisisobutyronitrile, and heated to 80° C. Into the heated solution, a mixed solution of 40.00 g of glycidyl methacrylate, 11.83 g of trifluoroethyl methacrylate, and 50.00 g of propylene glycol monomethyl ether was gradually added dropwise, and the resultant mixture was reacted at 80° C. for 14 hours to obtain a polymer solution. A GPC analysis showed that the weight average molecular weight of the obtained polymer was 7,000 in terms of standard polystyrene, and the epoxy value of the polymer solution was 0.88 eq/kg. The polymer obtained in this Synthesis Example was equivalent to an intermediate to synthesize a copolymer for an additive according to the present invention.

Synthesis Example 4

17.00 g of the polymer solution obtained in Synthesis Example 3, 2.63 g of N-(tert-butoxycarbonyl)-L-glycine, 0.09 g of benzyltriethylammonium chloride, and 7.36 g of propylene glycol monomethyl ether were mixed, and the mixture was heated to reflux for 14 hours with stirring to obtain a polymer solution. To this polymer solution, 6 g of a cation exchange resin (the product name: DOWEX [registered trademark] 550A, Muromachi Technos Co., Ltd.) and 6 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 13,600 in terms of standard polystyrene. The polymer obtained in this Synthesis Example was equivalent to a copolymer for an additive according to the present invention, and had an amino group protected with a tert-butoxycarbonyl group.

Synthesis Example 5

16.50 g of the polymer solution obtained in Synthesis Example 3, 2.76 g of N-(tert-butoxycarbonyl)-L-alanine, 0.08 g of benzyltriethylammonium chloride, and 7.97 g of propylene glycol monomethyl ether were mixed, and the mixture was heated to reflux for 14 hours with stirring to obtain a polymer solution. To this polymer solution, 6 g of a cation exchange resin (the product name: DOWEX [registered trademark] 550A, Muromachi Technos Co., Ltd.) and 6 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 13,200 in terms of standard polystyrene. The polymer obtained in this Synthesis Example was equivalent to a copolymer for an additive according to the present invention, and had an amino group protected with a tert-butoxycarbonyl group.

Synthesis Example 6

15.00 g of the polymer solution obtained in Synthesis Example 3, 3.07 g of N-(tert-butoxycarbonyl)-L-leucine, 0.08 g of benzyltriethylammonium chloride, and 9.48 g of propylene glycol monomethyl ether were mixed, and the mixture was heated to reflux for 14 hours with stirring to obtain a polymer solution. To this polymer solution, 6 g of a cation exchange resin (the product name: DOWEX [registered trademark] 550A, Muromachi Technos Co., Ltd.) and 6 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 13,900 in terms of standard polystyrene. The polymer obtained in this Synthesis Example was equivalent to a copolymer for an additive according to the present invention, and had an amino group protected with a tert-butoxycarbonyl group.

Synthesis Example 7

14.50 g of the polymer solution obtained in Synthesis Example 3, 3.20 g of N-(tert-butoxycarbonyl)-L-methionine, 0.07 g of benzyltriethylammonium chloride, and 10.09 g of propylene glycol monomethyl ether were mixed, and the mixture was heated to reflux for 14 hours with stirring to obtain a polymer solution. To this polymer solution, 6 g of a cation exchange resin (the product name: DOWEX [registered trademark] 550A, Muromachi Technos Co., Ltd.) and 6 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 20,600 in terms of standard polystyrene. The polymer obtained in this Synthesis Example was equivalent to a copolymer for an additive according to the present invention, and had an amino group protected with a tert-butoxycarbonyl group.

Synthesis Example 8

16.00 g of the polymer solution obtained in Synthesis Example 3, 2.91 g of N-(tert-butoxycarbonyl)-L-serine, 0.08 g of benzyltriethylammonium chloride, and 8.63 g of propylene glycol monomethyl ether were mixed, and the mixture was heated to reflux for 14 hours with stirring to obtain a polymer solution. To this polymer solution, 6 g of a cation exchange resin (the product name: DOWEX [registered trademark] 550A, Muromachi Technos Co., Ltd.) and 6 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 15,400 in terms of standard polystyrene. The polymer obtained in this Synthesis Example was equivalent to a copolymer for an additive according to the present invention, and had an amino group protected with a tert-butoxycarbonyl group.

Synthesis Example 9

15.00 g of the polymer solution obtained in Synthesis Example 2, 3.37 g of N-(tert-butoxycarbonyl)-L-proline, 0.09 g of benzyltriethylammonium chloride, and 12.70 g of propylene glycol monomethyl ether were mixed, and the mixture was heated to reflux for 15 hours with stirring to obtain a polymer solution. To this polymer solution, 6 g of a cation exchange resin (the product name: DOWEX [registered trademark] 550A, Muromachi Technos Co., Ltd.) and 6 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 12,300 in terms of standard polystyrene. The polymer obtained in this Synthesis Example was equivalent to a copolymer for an additive according to the present invention, and had a nitrogen heterocycle protected with a tert-butoxycarbonyl group.

Synthesis Example 10

15.00 g of the polymer solution obtained in Synthesis Example 3, 3.07 g of trans-N-(tert-butoxycarbonyl)-4-hydroxy-L-proline, 0.08 g of benzyltriethylammonium chloride, and 9.47 g of propylene glycol monomethyl ether were mixed, and the mixture was heated to reflux for 14 hours with stirring to obtain a polymer solution. To this polymer solution, 6 g of a cation exchange resin (the product name: DOWEX [registered trademark] 550A, Muromachi Technos Co., Ltd.) and 6 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 15,200 in terms of standard polystyrene. The polymer obtained in this Synthesis Example was equivalent to a copolymer for an additive according to the present invention, and had a nitrogen heterocycle protected with a tert-butoxycarbonyl group.

Synthesis Example 11

14.50 g of the polymer solution obtained in Synthesis Example 3, 3.20 g of N-carbobenzoxy-L-proline, 0.07 g of benzyltriethylammonium chloride, and 10.08 g of propylene glycol monomethyl ether were mixed, and the mixture was heated to reflux for 14 hours with stirring to obtain a polymer solution. To this polymer solution, 6 g of a cation exchange resin (the product name: DOWEX [registered trademark] 550A, Muromachi Technos Co., Ltd.) and 6 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 12,700 in terms of standard polystyrene. The polymer obtained in this Synthesis Example was a copolymer, and had a nitrogen heterocycle protected with a benzyloxycarbonyl group.

Synthesis Example 12

19.50 g of the polymer solution obtained in Synthesis Example 3, 2.23 g of L-pyroglutamic acid, 0.10 g of benzyltriethylammonium chloride, and 5.27 g of propylene glycol monomethyl ether were mixed, and the mixture was heated to reflux for 14 hours with stirring to obtain a polymer solution. To this polymer solution, 6 g of a cation exchange resin (the product name: DOWEX [registered trademark] 550A, Muromachi Technos Co., Ltd.) and 6 g of an anion exchange resin (the product name: Amberlite [registered trademark] 15JWET, Organo Corporation) were added, and the mixture was subjected to an ion exchange process at room temperature for 4 hours. A GPC analysis showed that the weight average molecular weight of the obtained polymer was 13,600 in terms of standard polystyrene. The polymer obtained in this Synthesis Example was a copolymer, and had a nitrogen heterocycle not protected with any protecting groups.

Example 1

1.50 g of the polymer solution (resin binder) obtained in Synthesis Example 1, 0.17 g of the polymer solution (additive) obtained in Synthesis Example 4, 0.06 g of tetramethoxymethyl glycoluril (the product name: POWDERLINK [registered trademark] 1174, manufactured by Nihon Cytec Industries Inc.), 0.01 g of 5-sulfosalicylic acid, 29.85 g of propylene glycol monomethyl ether, and 3.47 g of propylene glycol monoethyl ether were mixed and dissolved to prepare a resist underlayer film-forming composition of the present invention.

Example 2

1.50 g of the polymer solution (resin binder) obtained in Synthesis Example 1, 0.14 g of the polymer solution (additive) obtained in Synthesis Example 5, 0.06 g of tetramethoxymethyl glycoluril (the product name: POWDERLINK [registered trademark] 1174, manufactured by Nihon Cytec Industries Inc.), 0.01 g of 5-sulfosalicylic acid, 29.88 g of propylene glycol monomethyl ether, and 3.47 g of propylene glycol monoethyl ether were mixed and dissolved to prepare a resist underlayer film-forming composition of the present invention.

Example 3

1.50 g of the polymer solution (resin binder) obtained in Synthesis Example 1, 0.17 g of the polymer solution (additive) obtained in Synthesis Example 6, 0.06 g of tetramethoxymethyl glycoluril (the product name: POWDERLINK [registered trademark] 1174, manufactured by Nihon Cytec Industries Inc.), 0.01 g of 5-sulfosalicylic acid, 29.85 g of propylene glycol monomethyl ether, and 3.47 g of propylene glycol monoethyl ether were mixed and dissolved to prepare a resist underlayer film-forming composition of the present invention.

Example 4

1.50 g of the polymer solution (resin binder) obtained in Synthesis Example 1, 0.19 g of the polymer solution (additive) obtained in Synthesis Example 7, 0.06 g of tetramethoxymethyl glycoluril (the product name: POWDERLINK [registered trademark] 1174, manufactured by Nihon Cytec Industries Inc.), 0.01 g of 5-sulfosalicylic acid, 29.83 g of propylene glycol monomethyl ether, and 3.47 g of propylene glycol monoethyl ether were mixed and dissolved to prepare a resist underlayer film-forming composition of the present invention.

Example 5

1.50 g of the polymer solution (resin binder) obtained in Synthesis Example 1, 0.18 g of the polymer solution (additive) obtained in Synthesis Example 8, 0.06 g of tetramethoxymethyl glycoluril (the product name: POWDERLINK [registered trademark] 1174, manufactured by Nihon Cytec Industries Inc.), 0.01 g of 5-sulfosalicylic acid, 29.84 g of propylene glycol monomethyl ether, and 3.47 g of propylene glycol monoethyl ether were mixed and dissolved to prepare a resist underlayer film-forming composition of the present invention.

Example 6

2.00 g of the polymer solution (resin binder) obtained in Synthesis Example 1, 0.24 g of the polymer solution (additive) obtained in Synthesis Example 9, 0.09 g of tetramethoxymethyl glycoluril (the product name. POWDERLINK [registered trademark] 1174, manufactured by Nihon Cytec Industries Inc.), 0.01 g of 5-sulfosalicylic acid, 39.79 g of propylene glycol monomethyl ether, and 4.63 g of propylene glycol monoethyl ether were mixed and dissolved to prepare a resist underlayer film-forming composition of the present invention.

Example 7

1.50 g of the polymer solution (resin binder) obtained in Synthesis Example 1, 0.17 g of the polymer solution (additive) obtained in Synthesis Example 10, 0.06 g of tetramethoxymethyl glycoluril (the product name: POWDERLINK [registered trademark] 1174, manufactured by Nihon Cytec Industries Inc.), 0.01 g of 5-sulfosalicylic acid, 29.85 g of propylene glycol monomethyl ether, and 3.47 g of propylene glycol monoethyl ether were mixed and dissolved to prepare a resist underlayer film-forming composition of the present invention.

Comparative Example 1

2.00 g of the polymer solution (resin binder) obtained in Synthesis Example 1, 0.09 g of tetramethoxymethyl glycoluril (the product name: POWDERLINK [registered trademark] 1174, manufactured by Nihon Cytec Industries Inc.), 0.01 g of 5-sulfosalicylic acid, 36.96 g of propylene glycol monomethyl ether, and 4.29 g of propylene glycol monoethyl ether were mixed and dissolved to prepare a resist underlayer film-forming composition. This Comparative Example does not include an additive according to the present invention.

Comparative Example 2

1.50 g of the polymer solution (resin binder) obtained in Synthesis Example 1, 0.16 g of the polymer solution (additive) obtained in Synthesis Example 11, 0.06 g of tetramethoxymethyl glycoluril (the product name: POWDERLINK [registered trademark] 1174, manufactured by Nihon Cytec Industries Inc.), 0.01 g of 5-sulfosalicylic acid, 29.86 g of propylene glycol monomethyl ether, and 3.47 g of propylene glycol monoethyl ether were mixed and dissolved to prepare a resist underlayer film-forming composition. This Comparative Example includes an additive not according to the present invention.

Comparative Example 3

1.50 g of the polymer solution (resin binder) obtained in Synthesis Example 1, 0.18 g of the polymer solution (additive) obtained in Synthesis Example 12, 0.06 g of tetramethoxymethyl glycoluril (the product name: POWDERLINK [registered trademark] 1174, manufactured by Nihon Cytec Industries Inc.), 0.01 g of 5-sulfosalicylic acid, 29.84 g of propylene glycol monomethyl ether, and 3.47 g of propylene glycol monoethyl ether were mixed and dissolved to prepare a resist underlayer film-forming composition. This Comparative Example includes an additive not according to the present invention.

(Formation and Evaluation of Resist Pattern)

Each of the resist underlayer film-forming compositions prepared in Examples 1 to 7 and Comparative Examples 1 to 3 of the present specification was spin coated onto a silicon wafer on which a nitrogen-containing silicon oxide film (SiON) was evaporated (31.5 nm of the film thickness) so that the film thickness of the spin coated composition is 10 nm. The spin coated composition was then baked at 205° C. for 60 seconds to form a resist underlayer film. A resist solution (manufactured by JSR Corporation, the product name: AR2772JN) for ArF excimer lasers was spin coated onto the resist underlayer film, and baked at 110° C. for 90 seconds, and then exposed to an ArF excimer laser under a given condition by using an exposure device for ArF excimer lasers (manufactured by Nikon Corporation, NSR-S307E). After the exposure, the resist was baked at 110° C. for 90 seconds (PEB), cooled to room temperature on a cooling plate, developed, and rinsed to form a resist pattern.

The target line width was set to 80 nm line and space, and the dimension of a resist pattern at the highest exposure dose at which the resist pattern dose not collapse (the limit exposure dose) was observed (the limit dimension of pattern collapse) with a critical dimension SEM, and a relationship between the change of exposure dose and collapse of a resist pattern at the optimum focus was studied. This can confirm whether the use of an additive according to the present invention can prevent collapse of a resist pattern within a range of high exposure dose and a fine resist pattern can be formed. The cross sectional shape of a resist pattern at 80 nm line and space, which is the target line width, was observed with a cross sectional SEM. This can identify a resist shape that causes collapse of a resist pattern by using an additive according to the present invention.

Table 1 below shows the limit dimension of pattern collapse of the obtained resist pattern, the exposure dose in this limit (the limit exposure dose), and the cross sectional shape of the resist pattern. Smaller values are preferable for the limit dimension of pattern collapse.

TABLE 1

| Resist Underlayer Film-Forming Composition | Limit Exposure Dose | Limit Dimension of Pattern Collapse | Cross Sectional Shape of Resist Pattern |
| --- | --- | --- | --- |
| Example 1 | 33.5 mJ/cm$^2$ | 57.81 nm | Taper |
| Example 2 | 35 mJ/cm$^2$ | 54.14 nm | Taper |
| Example 3 | 35 mJ/cm$^2$ | 54.28 nm | Taper |
| Example 4 | 33.5 mJ/cm$^2$ | 53.36 nm | Taper |
| Example 5 | 35 mJ/cm$^2$ | 51.59 nm | Taper |
| Example 6 | 35 mJ/cm$^2$ | 54.68 nm | Taper |
| Example 7 | 35 mJ/cm$^2$ | 54.47 nm | Taper |
| Comparative Example 1 | 28 mJ/cm$^2$ | 65.58 nm | Undercut |
| Comparative Example 2 | 29 mJ/cm$^2$ | 65.13 nm | Undercut |
| Comparative Example 3 | 29 mJ/cm$^2$ | 63.13 nm | Undercut |

The results shown in Table 1 indicate that, when a resist underlayer film was formed with each of the resist underlayer film-forming compositions of Examples 1 to 7, which contained the additive of the present invention, a limit exposure dose was high, and a pattern collapse limit dimension was small as compared to those when a resist underlayer film was formed with each of the resist underlayer film-forming compositions of Comparative Examples 1 to 3. Thus, by the use of the resist underlayer film-forming compositions of Examples 1 to 7, collapse of resist patterns can be prevented in the formation of fine resist patterns. Furthermore, when a resist underlayer film was formed with each of the resist underlayer film-forming compositions of Examples 1 to 7, the cross sectional shape of the obtained resist pattern was a taper shape (trapezoidal shape). However, when a resist underlayer film was formed with each of the resist underlayer film-forming compositions of Comparative Examples 1 to 3, the cross sectional shape of the obtained resist pattern was an undercut shape. In the taper shape, the contact area between a resist pattern and a resist underlayer film increases, and thus collapse of the resist pattern can be prevented. As a conclusion, it was confirmed that an additive according to the present invention contained in each of the resist underlayer film-forming compositions of Examples 1 to 7 effectively prevented collapse of a resist pattern.

Although the embodiments of the present invention were explained as above, the technical scope of the present invention is not limited to these embodiments, and a variety of changes and improvements can be made thereto.

The invention claimed is:

1. An additive for a resist underlayer film-forming composition, comprising:
    a polymer having a structural unit of Formula (1):

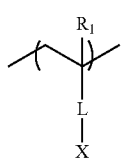

(1)

wherein:
    $R_1$ is a hydrogen atom or a methyl group;
    L is a divalent linking group; and
    X is an acyloxy a group having one of the following structures:

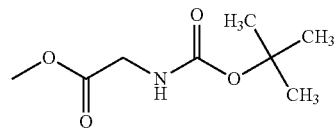
(a)

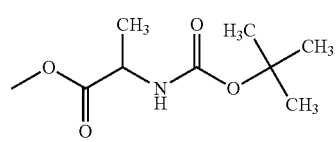
(b)

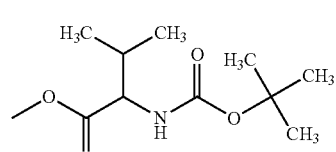
(c)

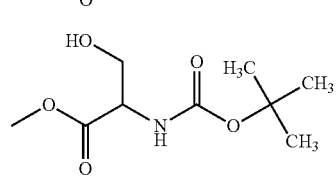
(d)

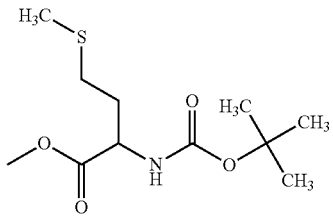
(e)

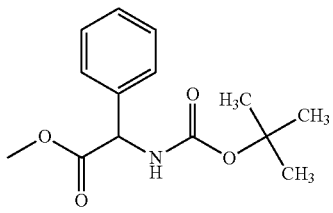
(f)

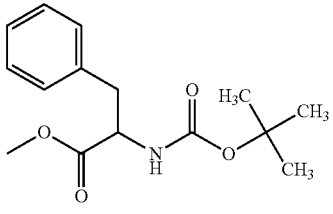
(g)

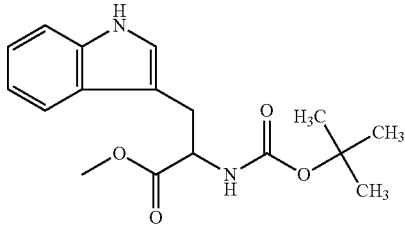
(h)

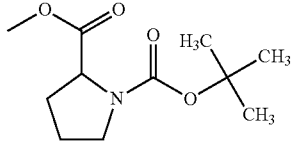
(i)

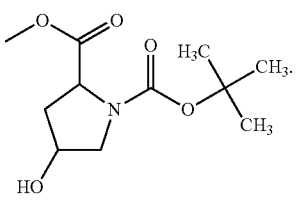
(j)

2. A resist underlayer film-forming composition for lithography, comprising:
    a resin binder;
    an organic solvent; and
    the additive for a resist underlayer film-forming composition as claimed in claim 1.

3. The resist underlayer film-forming composition for lithography according to claim 2, further comprising:
    a cross-linker; and
    a cross-linking catalyst.

4. A method for producing a semiconductor element, the method comprising:
    applying the resist underlayer film-forming composition as claimed in claim 2 onto a substrate having a film to be processed in which a transfer pattern is to be formed;

baking the resist underlayer film-forming composition thus applied to form a resist underlayer film;
covering the resist underlayer film with a resist;
irradiating the substrate covered with the resist with radiation selected from the group consisting of a KrF excimer laser, an ArF excimer laser, an extreme ultraviolet, and an electron beam;
forming a resist pattern by development; and
transferring a pattern onto the substrate by dry etching using the resist pattern as a mask.

5. An additive for a resist underlayer film-forming composition, comprising:
a copolymer having a structural unit of Formula (1') and a structural unit of Formula (2):

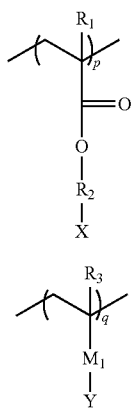

(1')

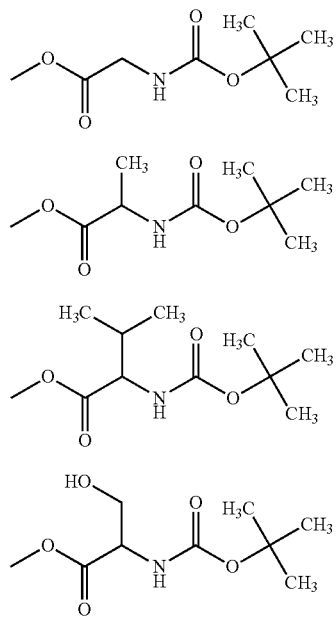

(2)

wherein:
each of $R_1$ and $R_3$ is independently a hydrogen atom or a methyl group;
$R_2$ is a $C_{2-4}$ alkylene group having one or more hydrogen atoms optionally substituted with hydroxy group(s);
X is a group having one of the following structures:

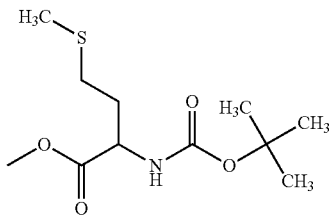

(e)

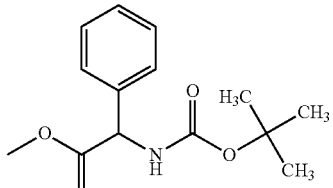

(f)

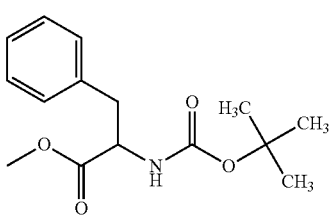

(g)

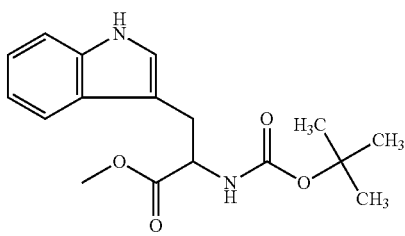

(h)

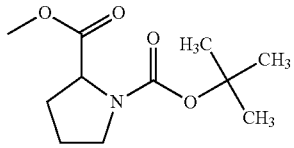

(i)

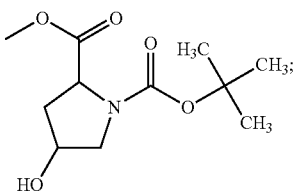

(j)

$M_1$ is a direct binding, or a linking group having at least one selected from the group consisting of —C(=O)—, —CH$_2$—, and —O—;
Y is a $C_{2-6}$ alkyl group in which at least one hydrogen atom is substituted with a fluorine atom; and
p and q represent a molar ratio of the structural units contained in the copolymer, in which each of p and q is within a range from 0.1 to 0.9, provided that p+q=1 is satisfied.

6. An additive for a resist underlayer film-forming composition,
comprising:
a copolymer having a structural unit of Formula (1'), a structural unit of Formula (2), and a structural unit of Formula (3):

(3)

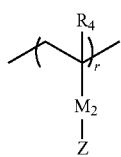

wherein:
each of $R_1$ and $R_3$ is independently a hydrogen atom or a methyl group;
$R_2$ is a $C_{2-4}$ alkylene group having one or more hydrogen atoms optionally substituted with hydroxy group(s);
X is a group having one of the following structures:

(a)
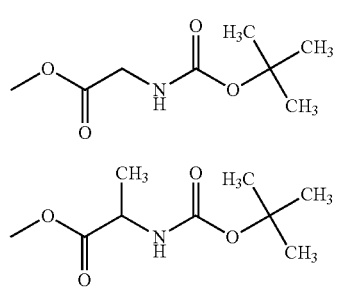

(b)

(c)

(d)

(e)
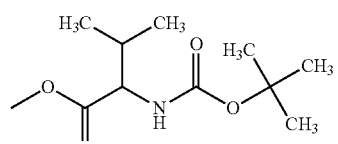

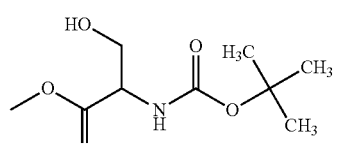

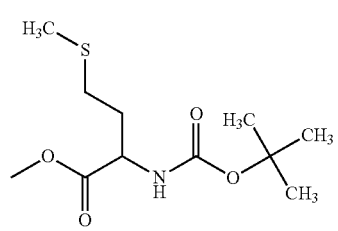

(f)
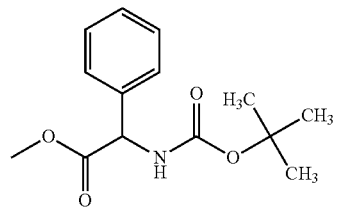

-continued (g)
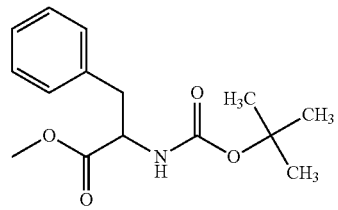

(h)

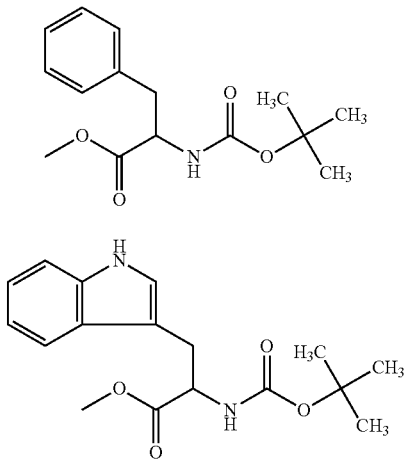

(i)

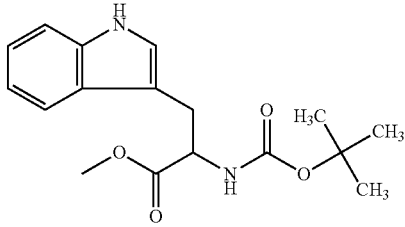

(j)
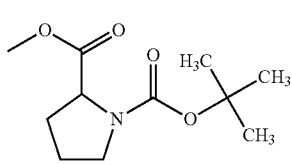

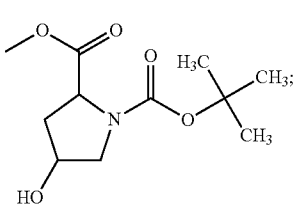

$M_1$ is a direct binding, or a linking group having at least one selected from the group consisting of —C(=O)—, —CH$_2$— and —O—;

Y is a $C_{2-6}$ alkyl group in which at least one hydrogen atom is substituted with a fluorine atom;

$R_4$ is a hydrogen atom or a methyl group;

$M_2$ is a direct binding, or a linking group having at least one selected from the group consisting of —C(=O)—, —CH$_2$—, and —O—;

Z is a $C_{1-6}$ alkyl group, an aryl group, or an arylalkyl group that has at least one of a hydroxy group, an alkoxy group, and a carboxy group; or when $M_2$ is a direct binding, Z is a carboxy group; and p, q, and r represent a molar ratio of the structural units contained in the polymer, and each of p, q, and r is within a range from 0.1 to 0.9, provided that p+q+r=1 is satisfied.

* * * * *